(12) United States Patent
Lee

(10) Patent No.: US 7,919,987 B1
(45) Date of Patent: Apr. 5, 2011

(54) LOGIC SIGNAL TRANSMITTING CIRCUIT

(75) Inventor: Chow-Peng Lee, Sinshih Township, Tainan County (TW)

(73) Assignee: Himax Analogic, Inc., Sinshih Township, Tainan County (TW)

(*) Notice: Subject to any disclaimer, the term of this patent is extended or adjusted under 35 U.S.C. 154(b) by 0 days.

(21) Appl. No.: 12/720,124

(22) Filed: Mar. 9, 2010

(51) Int. Cl.
*H03K 19/094* (2006.01)
*H03K 19/0175* (2006.01)

(52) U.S. Cl. ............................. 326/83; 326/82; 326/81

(58) Field of Classification Search .................. None
See application file for complete search history.

(56) References Cited

U.S. PATENT DOCUMENTS 6,529,050 B1 * 3/2003 Kuo et al. .................. 327/112
6,741,106 B2 * 5/2004 Humphrey .................. 327/108

* cited by examiner

*Primary Examiner* — Anh Q Tran
(74) *Attorney, Agent, or Firm* — Thomas, Kayden, Horstemeyer & Risley, LLP

(57) ABSTRACT

A logic signal transmitting circuit includes a CMOS inverter, a first transistor switch and an inverter. The CMOS inverter includes a p-type transistor and an n-type transistor and is configured for inverting an input signal. The first transistor switch is connected to an input of the CMOS inverter and controlled by the input signal. The inverter is connected between the p-type transistor and the first transistor switch, in which the inverter turns off the p-type transistor when the first transistor switch is turned on and the inverter turns on the p-type transistor when the first transistor switch is turned off.

18 Claims, 4 Drawing Sheets

LOGIC SIGNAL TRANSMITTING CIRCUIT

BACKGROUND

1. Technical Field

The present disclosure relates to an electrical device. More particularly, the present disclosure relates to a logic signal transmitting circuit.

2. Description of Related Art

In a conventional circuit for transmitting an external logic signal (e.g. clock signal), a high voltage level of the external logic signal varies in different conditions although a low voltage level of the external logic signal is fixed to a ground. For example, the high voltage level of the external logic signal may vary in the range between 1.5 V and 5.0 V.

However, if the high voltage level of the external logic signal is unstable, the circuit subsequent to the logic signal transmission circuit may operate with the unstable logic signal and thus perform misoperation.

In addition, when the logic signal transits from the low voltage level to the high voltage level, there is a substantial propagation delay due to the transition, such that the transmission of the logic signal cannot be performed efficiently.

SUMMARY

In accordance with one embodiment of the present invention, a logic signal transmitting circuit is provided. The logic signal transmitting circuit includes a CMOS inverter, a first transistor switch and an inverter. The CMOS inverter includes a p-type transistor and an n-type transistor and is configured for inverting an input signal. The first transistor switch is connected to an input of the CMOS inverter and controlled by the input signal. The inverter is connected between the p-type transistor and the first transistor switch, in which the inverter turns off the p-type transistor when the first transistor switch is turned on and the inverter turns on the p-type transistor when the first transistor switch is turned off.

In accordance with another embodiment of the present invention, a logic signal transmitting circuit is provided. The logic signal transmitting circuit includes a CMOS inverter, a first transistor switch and an inverter. The CMOS inverter includes a p-type transistor and an n-type transistor connected in cascade with the p-type transistor. The first transistor switch has a control terminal connected to a gate of the n-type transistor. The inverter has an input and an output connected to a gate of the p-type transistor, and the first transistor switch is connected between the input of the inverter and a ground.

For the foregoing embodiments of the present invention, the logic signal transmitting circuit not only can convert the external logic signal into the required logic signal even if the high voltage level of the external logic signal unstably ranges between 1.5 V and 5.0 V, but also can prevent from generating the shoot-through current, and the transmission of the logic signal even can be performed efficiently due to the less propagation delay.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiments, with reference to the accompanying drawings as follows.

DESCRIPTION OF THE EMBODIMENTS

In the following description, several specific details are presented to provide a thorough understanding of the embodiments of the present invention. One skilled in the relevant art will recognize, however, that the present invention can be practiced without one or more of the specific details, or in combination with or with other components, etc. In other instances, well-known implementations or operations are not shown or described in detail to avoid obscuring aspects of various embodiments of the present invention.

The terms used in this specification generally have their ordinary meanings in the art and in the specific context where each term is used. The use of examples anywhere in this specification, including examples of any terms discussed herein, is illustrative only, and in no way limits the scope and meaning of the invention or of any exemplified term. Likewise, the present invention is not limited to various embodiments given in this specification.

As used herein, the terms "comprising," "including," "having," "containing," "involving," "essentially consisting," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
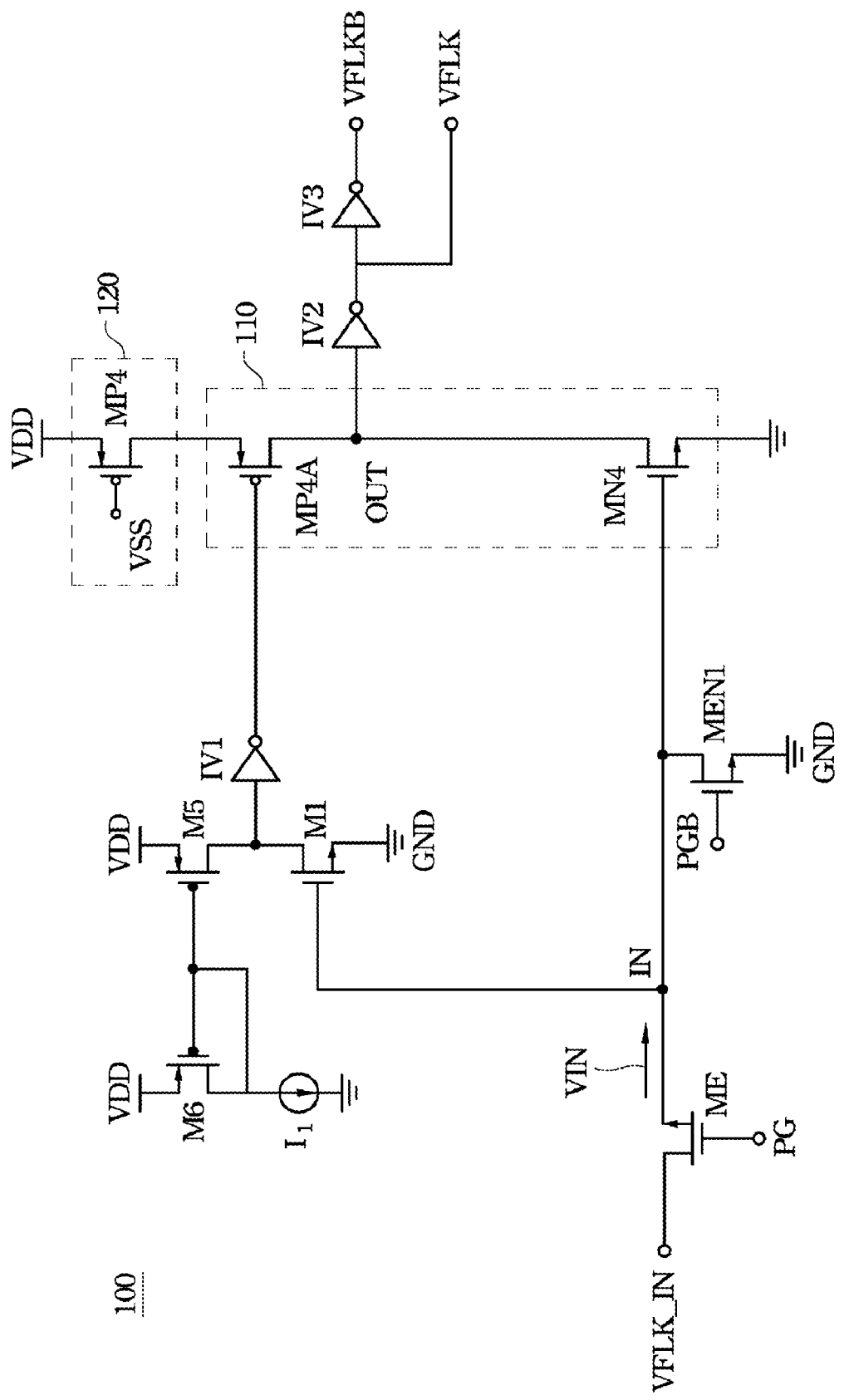
FIG. 1 is a diagram of a logic signal transmitting circuit according to one embodiment of the present invention.

FIG. 1 is a diagram of a logic signal transmitting circuit according to one embodiment of the present invention. The logic signal transmitting circuit 100 may be employed in a gate pulse modulator. The logic signal transmitting circuit 100 includes a CMOS inverter 110, a transistor switch M1 and an inverter IV1. The CMOS inverter 110 has an input IN and inverts an input signal VIN from the input IN to output a logic signal VFLK or VFLKB. The CMOS inverter 110 includes a p-type transistor MP4A and an n-type transistor MN4, in which the transistor MN4 is connected in cascade with the transistor MP4A and has a gate connected to the input IN. The transistor switch M1 has a control terminal connected to the input IN and the gate of the transistor MN4 and is thus controlled by the input signal VIN. The inverter IV1 is connected between the transistor MP4A and the transistor switch M1 and also has an input and an output connected to a gate of the transistor MP4A. The transistor switch M1 is connected between the input of the inverter IV1 and a ground GND.

In operation, the inverter IV1 turns off the transistor MP4A when the transistor switch M1 is turned on, and the inverter IV1 turns on the transistor MP4A when the transistor switch M1 is turned off.

Specifically, when the input signal VIN is asserted at a high level (e.g. between 1.5 V and 5.0 V) at the input IN (or the gate of the transistor MN4), the transistor switch M1 is turned on by the input signal VIN, the input of the inverter IV1 is pulled down to the ground GND (low level) through the transistor switch M1, and the output of the inverter IV1 is pulled up to a power voltage VDD (high level) to turn off the transistor MP4A. The transistor MN4 is thus turned on by the input signal VIN to pull down an output OUT of the CMOS inverter 110 to the ground GND.

On the other hand, when the input signal VIN is asserted at a low level (e.g. ground), the transistor switch M1 is turned off by the input signal VIN, the input of the inverter IV1 is pulled up to VDD (high level), for example, through a transistor M5, and the output of the inverter IV1 is pulled down to ground (low level) to turn on the transistor MP4A, such that the output OUT of the CMOS inverter 110 is pulled up to VDD (high level), for example, through a current source 120. The current source 120 is connected between the voltage VDD and transistor MP4A and may be implemented by a transistor MN4 controlled by a low-level voltage VSS to be continuously turned on. The transistor MN4 is thus turned off by the input signal VIN.

It is noticed that when the voltage level of the input signal VIN increases before reaching to a maximum (i.e. transiting from the low level before reaching to the high level) and, for example, to reach the threshold voltage (e.g. 0.7 V) of the transistor switch M1 such that the transistor switch M1 is turned on, the input of the inverter IV1 is instantly pulled down to the ground GND through the transistor switch M1, the output of the inverter IV1 is instantly pulled up to VDD to turn off the transistor MP4A, and the transistor MN4 is turned on by the input signal VIN. Accordingly, even if the high voltage level of the input signal VIN unstably ranges between 1.5 V and 5.0 V, the logic signal transmitting circuit 100 still can convert the input signal VIN into the required logic signal.

Furthermore, since the voltage level of the input signal VIN transits from the low level to the high level requires a substantial duration thus causing a propagation delay in the logic signal transmitting circuit 100, the propagation delay can be reduced because the input of the inverter IV1 is instantly pulled down to the ground GND through the transistor switch M1 and then the output of the inverter IV1 is instantly pulled up to VDD to turn off the transistor MP4A when the voltage level of the input signal VIN increases before reaching to the high level and to turn on the transistor switch M1. As a result, the shoot-through current generated when the CMOS inverter 110 performs switching can be avoided and the transmission of the logic signal can thus be performed efficiently due to the less propagation delay.

In the present embodiment, the logic signal transmitting circuit 100 may further include an initiation transistor MENI for initiating the CMOS inverter, in which the initiation transistor MENI has a control terminal for receiving an initial signal PGB and is connected between the gate of the transistor MN4 and the ground GND. Specifically, when the logic signal transmitting circuit 100 is not stable yet, the initial signal PGB is asserted to turn on the transistor MENI to disable the CMOS inverter 110, so as to configure an initial state of the CMOS inverter 110 and the subsequent circuit.

In the present embodiment, the logic signal transmitting circuit 100 may further include an ESD transistor ME, in which the transistor ME has a control terminal for receiving a signal PG inverted by the initial signal PGB and is connected between the gate of the transistor MN4 and an input node for receiving an external logic signal VFLK_IN. The transistor ME is controlled by the signal PG to perform electrostatic discharging and to convey the logic signal VFLK_IN as the input signal VIN.

Figure 2:
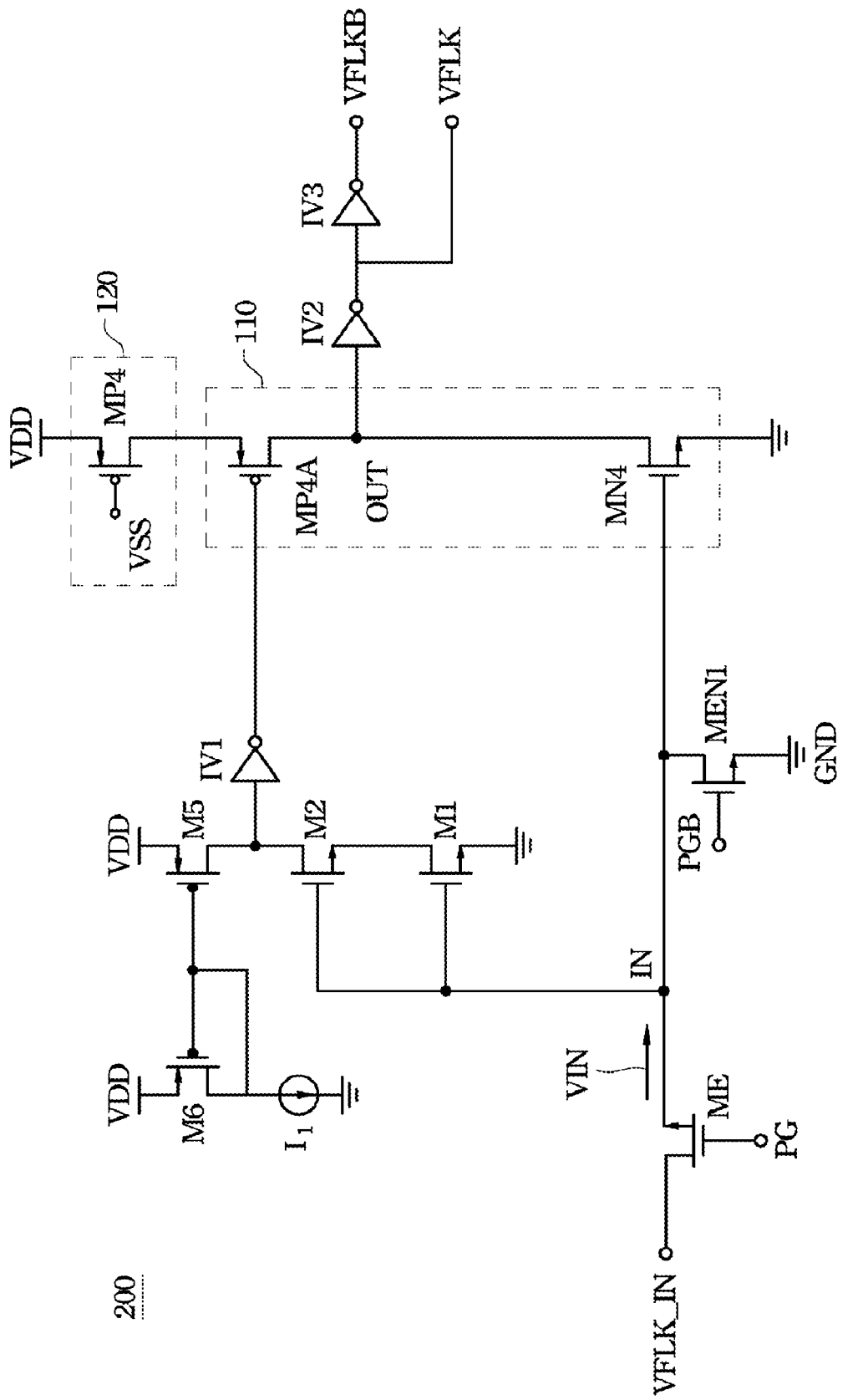
FIG. 2 is a diagram of a logic signal transmitting circuit according to another embodiment of the present invention.

FIG. 2 is a diagram of a logic signal transmitting circuit according to another embodiment of the present invention. Compared to FIG. 1, the logic signal transmitting circuit 200 further includes a transistor switch M2 connected in cascade with the transistor switch M1. The transistor switch M2 is connected between the transistor switch M1 and the input of the inverter IV1. The transistor switch M2 has a control terminal connected to the gate of the transistor MN4 (or input IN) to be controlled by the input signal VIN.

In operation, the logic signal transmitting circuit 200 including the transistor switches M1 and M2 operates similarly to the logic signal transmitting circuit 100 including the transistor switch M1. For example, when the input signal VIN is asserted at the high level at the input IN (or the gate of the transistor MN4), the transistor switches M1 and M2 are both turned on by the input signal VIN, the input of the inverter IV1 is pulled down to the ground GND (low level) through the transistor switches M1 and M2, and the output of the inverter IV1 is pulled up to VDD (high level) to turn off the transistor MP4A.

Likewise, when the voltage level of the input signal VIN increases before reaching to a maximum (i.e. transiting from the low level before reaching to the high level) and, for example, to reach the threshold voltages of the transistor switches M1 and M2 such that the transistor switch M1 and M2 are turned on, the input of the inverter IV1 is instantly pulled down to the ground GND through the transistor switches M1 and M2, the output of the inverter IV1 is instantly pulled up to VDD to turn off the transistor MP4A, and the transistor MN4 is turned on by the input signal VIN. Accordingly, even if the high voltage level of the input signal VIN unstably ranges between 1.5 V and 5.0 V, the logic signal transmitting circuit 200 still can convert the input signal VIN into the required logic signal.

Furthermore, the propagation delay can be reduced because the input of the inverter IV1 is instantly pulled down to the ground GND through the transistor switches M1 and M2 when the voltage level of the input signal VIN increases before reaching to the high level and to turn on the transistor switches M1 and M2. As a result, the shoot-through current can be avoided and the transmission of the logic signal can thus be performed efficiently as well.

Figure 3:
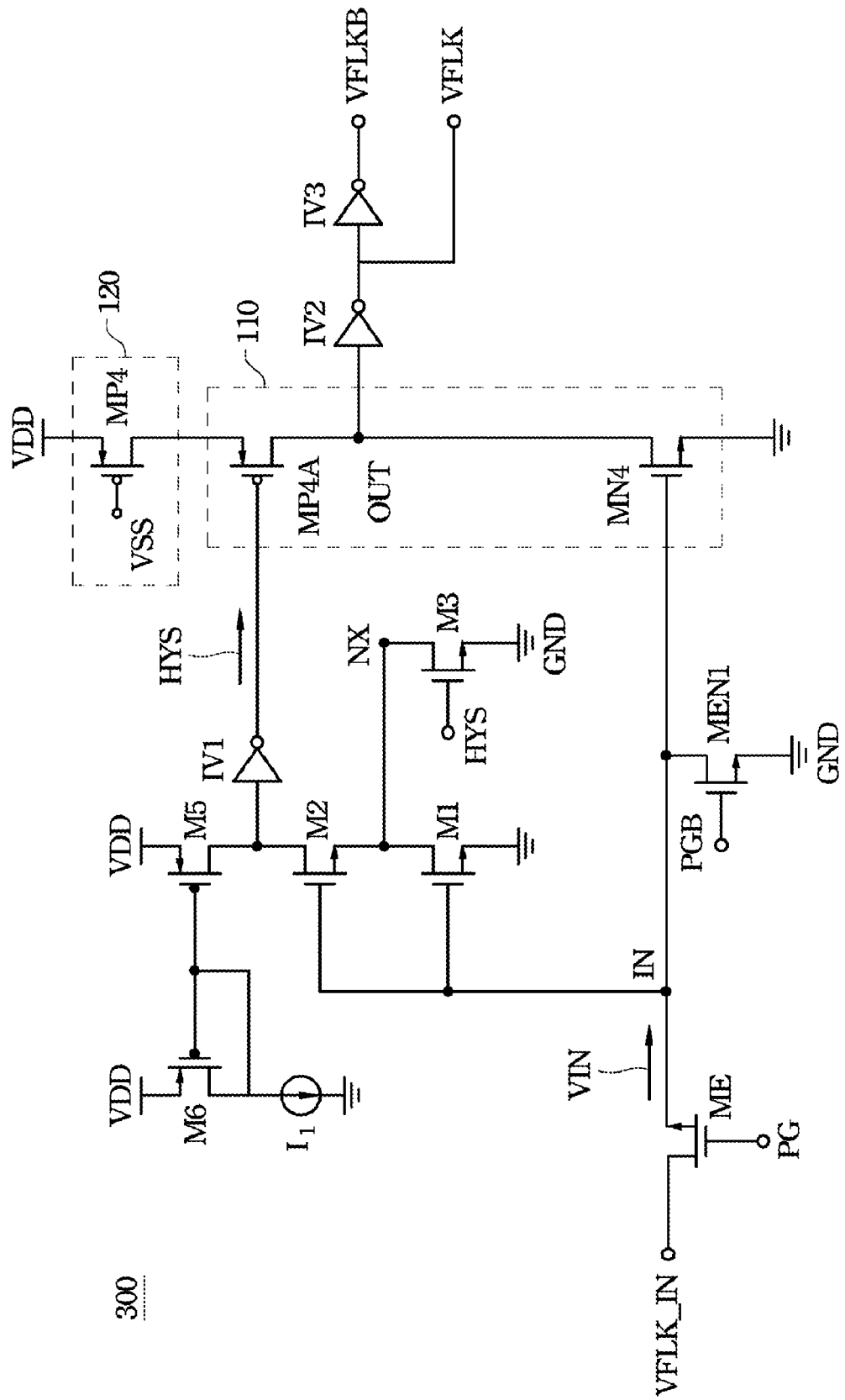
FIG. 3 is a diagram of a logic signal transmitting circuit according to yet another embodiment of the present invention.

FIG. 3 is a diagram of a logic signal transmitting circuit according to yet another embodiment of the present invention. Compared to FIG. 2, the logic signal transmitting circuit 300 further includes a hysteresis transistor M3 for endowing the logic signal transmitting circuit 300 with a hysteresis characteristic and controlled by the inverter IV1. The hysteresis transistor M3 is connected in cascade with the transistor switch M2 and in parallel with the transistor switch M1 and also has a control terminal connected to the output of the inverter IV1 to receive the signal HSY outputted from the inverter IV1.

Figure 4:
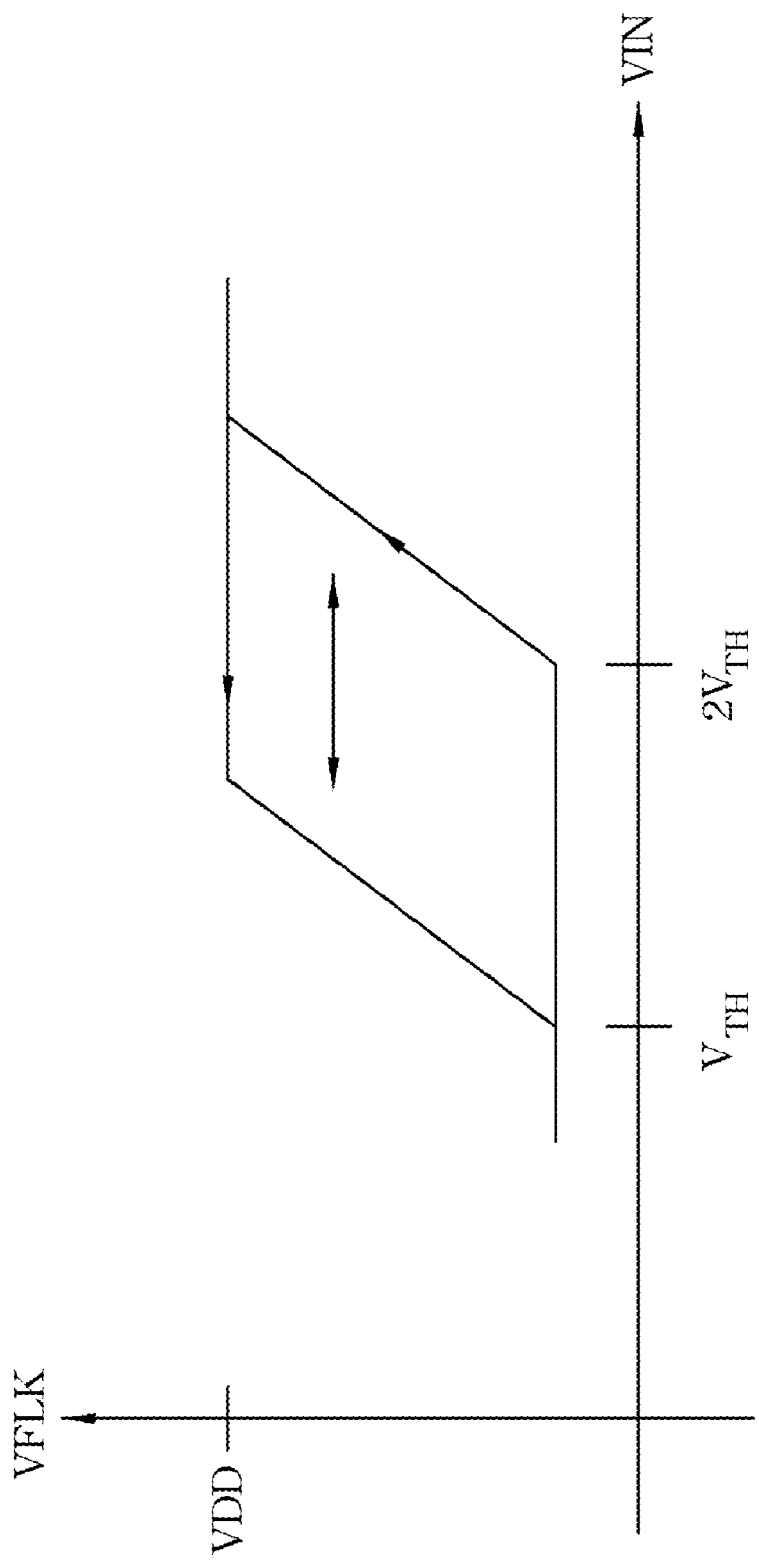
FIG. 4 is a hysteresis diagram of the input signal relative to the output logic signal.

The hysteresis transistor M3 endows the logic signal transmitting circuit 300 with the hysteresis characteristic when operating with the transistor switches M1 and M2. FIG. 4 is a hysteresis diagram of the input signal VIN relative to the output logic signal VFLK. Refer to FIG. 3 and FIG. 4. When the voltage level of the input signal VIN increases to two threshold voltages ($2V_{TH}$) to turn on the transistor switches M1 and M2, the signal HYS from the inverter IV1 is pulled to VDD (high level) to turn on the hysteresis transistor M3. At this moment, the hysteresis transistor M3 is more turned on than the transistor switch M1 is, and thus the node NX can be ideally regarded as being connected to the ground GND. After that, when the voltage level of the input signal VIN decreases to one threshold voltage ($V_{TH}$), the transistor switch M2 is turned off. As a result, the logic signal transmitting circuit 300 can be endowed with the hysteresis characteristic by the hysteresis transistor M3 when the hysteresis transistor M3 operates with transistor switches M1 and M2.

In addition, the transition point (i.e. voltage $V_{TH}$ or $2V_{TH}$) can be modified by changing the size of one or both of the transistor switches M1 and M2. The transition point can be increased to be more than 1.0 V by connecting the transistor switch M1 in cascade with the transistor switch M2. If the transistor switch M2 is saved, the transition point may become the threshold voltage (normally 0.7 V~0.9 V) of the transistor MN4.

For the foregoing embodiments of the present invention, the logic signal transmitting circuit not only can convert the external logic signal into the required logic signal even if the high voltage level of the external logic signal unstably ranges between 1.5 V and 5.0 V, but also can prevent from generating the shoot-through current, and the transmission of the logic signal even can be performed efficiently due to the less propagation delay.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. A logic signal transmitting circuit, comprising:
   a CMOS inverter comprising a p-type transistor and an n-type transistor, for inverting an input signal;
   a first transistor switch connected to an input of the CMOS inverter and configured to be controlled by the input signal;
   an inverter connected between the p-type transistor and the first transistor switch, wherein the inverter turns off the p-type transistor when the first transistor switch is turned on and the inverter turns on the p-type transistor when the first transistor switch is turned off; and
   a second transistor switch connected between the first transistor switch and an input of the inverter and configured to be controlled by the input signal.

2. The logic signal transmitting circuit as claimed in claim 1, wherein when the input signal is asserted at a high level, the n-type transistor is turned on by the input signal to pull down an output of the CMOS inverter to a ground.

3. The logic signal transmitting circuit as claimed in claim 2, wherein when the input signal is asserted at a low level, the first transistor switch is turned off by the input signal, such that the p-type transistor is turned on to pull up the output of the CMOS inverter to a power voltage.

4. The logic signal transmitting circuit as claimed in claim 1, wherein when a voltage level of the input signal increases before reaching to a maximum such that first transistor switch is turned on, an input of the inverter is pulled down to a ground through the first transistor switch and an output of the inverter is pulled up to a power voltage.

5. The logic signal transmitting circuit as claimed in claim 1, wherein when a voltage level of the input signal increases before reaching to a maximum such that the first and the second transistor switch are turned on, the input of the inverter is pulled down to a ground through the first and the second transistor switch and an output of the inverter is pulled up to a power voltage.

6. The logic signal transmitting circuit as claimed in claim 1, further comprising:
   a hysteresis transistor for endowing the logic signal transmitting circuit with a hysteresis characteristic.

7. The logic signal transmitting circuit as claimed in claim 6, wherein the hysteresis transistor is connected in cascade with the second transistor switch and in parallel with the first transistor switch.

8. The logic signal transmitting circuit as claimed in claim 7, wherein the hysteresis transistor is controlled by the inverter.

9. The logic signal transmitting circuit as claimed in claim 1, further comprising:
   an initiation transistor for initiating the CMOS inverter.

10. A logic signal transmitting circuit, comprising:
    a CMOS inverter comprising a p-type transistor and an n-type transistor connected in cascade with the p-type transistor;
    a first transistor switch having a control terminal connected to a gate of the n-type transistor;
    an inverter having an input and an output connected to a gate of the p-type transistor, the first transistor switch being connected between the input of the inverter and a ground; and
    a second transistor switch having a control terminal connected to the gate of the n-type transistor, the second transistor being connected in cascade with the first transistor switch and between the first transistor switch and the input of the inverter.

11. The logic signal transmitting circuit as claimed in claim 10, wherein when an input signal is asserted at the gate of the n-type transistor and a voltage level of the input signal increases before reaching to a maximum such that the first and the second transistor switch are turned on, the input of the inverter is pulled down to the ground through the first and the second transistor switch and the output of the inverter is pulled up to a power voltage.

12. The logic signal transmitting circuit as claimed in claim 10, further comprising:
    a hysteresis transistor having a control terminal connected to the output of the inverter, the hysteresis transistor being connected in cascade with the second transistor switch and in parallel with the first transistor switch.

13. The logic signal transmitting circuit as claimed in claim 12, wherein the hysteresis transistor endows the logic signal transmitting circuit with a hysteresis characteristic when operating with the first and the second transistor switch.

14. The logic signal transmitting circuit as claimed in claim 12, further comprising:
    an initiation transistor having a control terminal for receiving an initial signal and connected between the gate of the n-type transistor and the ground.

15. The logic signal transmitting circuit as claimed in claim 14, further comprising:
    a current source connected between a power voltage and the p-type transistor.

16. The logic signal transmitting circuit as claimed in claim 15, further comprising:
    an ESD transistor having a control terminal for receiving a signal inverted by the initial signal, the ESD transistor being connected between the gate of the n-type transistor and an input node for receiving an input signal.

17. The logic signal transmitting circuit as claimed in claim 10, wherein when an input signal is asserted at the gate of the n-type transistor and a voltage level of the input signal increases before reaching to a maximum such that the first transistor switch is turned on, the input of the inverter is pulled down to the ground through the first transistor switch and the output of the inverter is pulled up to a power voltage.

18. The logic signal transmitting circuit as claimed in claim 10, wherein when an input signal is asserted at a high level at the gate of the n-type transistor, the n-type transistor is turned on by the input signal to pull down an output of the CMOS inverter to the ground, and the first transistor switch is turned on by the input signal.

* * * * *